(12) United States Patent
Huang et al.

(10) Patent No.: US 12,096,575 B2
(45) Date of Patent: Sep. 17, 2024

(54) CARRYING MODULE AND ELECTRONIC DEVICE

(71) Applicant: Wistron Corporation, New Taipei (TW)

(72) Inventors: Weijie Huang, New Taipei (TW); Chia-Hsin Liu, New Taipei (TW); Ying Li, New Taipei (TW)

(73) Assignee: Wistron Corporation, New Taipei (TW)

( * ) Notice: Subject to any disclaimer, the term of this patent is extended or adjusted under 35 U.S.C. 154(b) by 239 days.

(21) Appl. No.: 17/876,476

(22) Filed: Jul. 28, 2022

(65) Prior Publication Data
US 2023/0413461 A1    Dec. 21, 2023

(30) Foreign Application Priority Data

Jun. 21, 2022    (CN) .......................... 202210705930.1

(51) Int. Cl.
   *H05K 5/02*    (2006.01)
   *H05K 5/03*    (2006.01)

(52) U.S. Cl.
   CPC ............. *H05K 5/0217* (2013.01); *H05K 5/03* (2013.01); *F28F 2280/04* (2013.01)

(58) Field of Classification Search
   CPC ............................... H05K 5/0217; H05K 5/03
   See application file for complete search history.

(56) References Cited

U.S. PATENT DOCUMENTS

| | | | | |
|---|---|---|---|---|
| 6,396,685 | B1* | 5/2002 | Chien | G06F 1/184 361/679.41 |
| 7,894,210 | B1* | 2/2011 | Searby | H05K 7/1424 361/752 |
| 9,110,640 | B2* | 8/2015 | Lin | G06F 1/185 |
| 10,813,245 | B2* | 10/2020 | Liu | H05K 7/20145 |
| 11,324,136 | B2* | 5/2022 | Rossi | H05K 7/1408 |
| 2021/0132651 | A1* | 5/2021 | Hasse | G06F 1/181 |
| 2021/0259123 | A1* | 8/2021 | Lin | G11B 33/122 |
| 2022/0071028 | A1* | 3/2022 | Yang | H05K 7/20145 |

FOREIGN PATENT DOCUMENTS

| | | |
|---|---|---|
| CN | 102281733 | 12/2011 |
| CN | 206270830 | 6/2017 |

OTHER PUBLICATIONS

"Office Action of Taiwan Counterpart Application", issued on Feb. 15, 2023, pp. 1-7.

* cited by examiner

*Primary Examiner* — Daniel J Rohrhoff
(74) *Attorney, Agent, or Firm* — JCIPRNET

(57) ABSTRACT

A carrying module configured to carry a functional assembly includes a main casing, a cover, a stop assembly, and an assist assembly. The cover is detachably assembled to the main casing. The stop assembly is disposed on the main casing and has a stop portion. The stop portion is adapted to stop the cover on an assembling path of the cover. The assist assembly is disposed on the main casing and contacts the stop assembly, such that the stop portion is away from the assembling path of the cover. In addition, an electronic device including the carrying module is also provided.

20 Claims, 19 Drawing Sheets

CARRYING MODULE AND ELECTRONIC DEVICE

CROSS-REFERENCE TO RELATED APPLICATION

This application claims the priority benefit of China application serial no. 202210705930.1, filed on Jun. 21, 2022. The entirety of the above-mentioned patent application is hereby incorporated by reference herein and made a part of this specification.

BACKGROUND

Technical Field

The disclosure is related to a carrying module and an electronic device having the same, and particularly to a carrying module and an electronic device having the same.

Description of Related Art

A carrying module for carrying functional assembly such as expansion card can be configured in the electronic device. To provide the expansion card with good heat dissipation efficiency, it is usually essential to dispose a wind scooper inside the main casing before assembling the cover of the carrying module to the main casing of the carrying module, thereby directing the heat dissipation airflow to the expansion card. However, during the assembling process, users may directly assemble the cover to the main casing due to negligence, thereby omitting the assembly of the wind scooper, resulting in a decrease in heat dissipation efficiency.

SUMMARY

The disclosure provides a carrying module and an electronic device, which prevents users from omitting the assembly of the wind scooper due to negligence.

The carrying module of the disclosure is configured to carry a functional assembly and includes a main casing, a cover, a stop assembly, and an assist assembly. The cover is detachably assembled to the main casing. The stop assembly is disposed on the main casing and has a stop portion. The cover is stopped by the stop portion on an assembling path of the cover selectively. The assist assembly is disposed on the main casing and contacts the stop assembly, wherein when the assist assembly contacts the stop assembly, the stop portion is away from the assembling path of the cover.

The electronic device of the disclosure includes an electronic device main body and a carrying module. The carrying module includes a main casing, a cover, a stop assembly, and an assist assembly. The main casing is disposed within the electronic device main body. The cover is detachably assembled to the main casing. The stop assembly is disposed on the main casing and has a stop portion. The cover is stopped by the stop portion on an assembling path of the cover selectively. The assist assembly is disposed on the main casing and contacts the stop assembly, wherein when the assist assembly contacts the stop assembly, the stop portion is away from the assembling path of the cover.

In an embodiment of the disclosure, the carrying module further includes a functional assembly, the functional assembly is pressed by the assist assembly against the main casing, the functional assembly is an expansion card, a set of heat dissipation fins, a memory assembly, or a cable. The assist assembly is a wind scooper or a cable clip.

In an embodiment of the disclosure, the stop assembly has an elastic piece. The stop portion is located in the elastic piece.

In an embodiment of the disclosure, the assist assembly has a guiding portion and a limiting portion. The guiding portion is adjacent to the limiting portion and is adapted to guide the stop portion to move to the limiting portion. The stop portion of the stop assembly is guided by the guiding portion to move toward the limiting portion, and the stop portion is limited to the limiting portion away from the assembling path of the cover.

In an embodiment of the disclosure, the assist assembly has a pressing portion. The pressing portion presses the functional assembly against the main casing.

In an embodiment of the disclosure, the main casing has a guiding slot. The guiding slot has a first extension section and a second extension section that are perpendicular to each other. The cover has a guide pin. The guide pin is adapted to move within the guiding slot.

In an embodiment of the disclosure, the second extension section is parallel to the assembling path of the cover.

In an embodiment of the disclosure, the cover has an opening slot, and when the stop portion extends into the opening slot, the cover is stopped by the stop portion.

In an embodiment of the disclosure, the stop assembly has a support portion. The support portion is adjacent to the stop portion. When the stop portion extends into the opening slot, the support portion supports the cover.

In an embodiment of the disclosure, the assist assembly has an engaging portion. The main casing has an engaging slot. The engaging portion and the engaging slot cooperate to position the assist assembly on the main casing.

DESCRIPTION OF THE EMBODIMENTS

Figure 1:
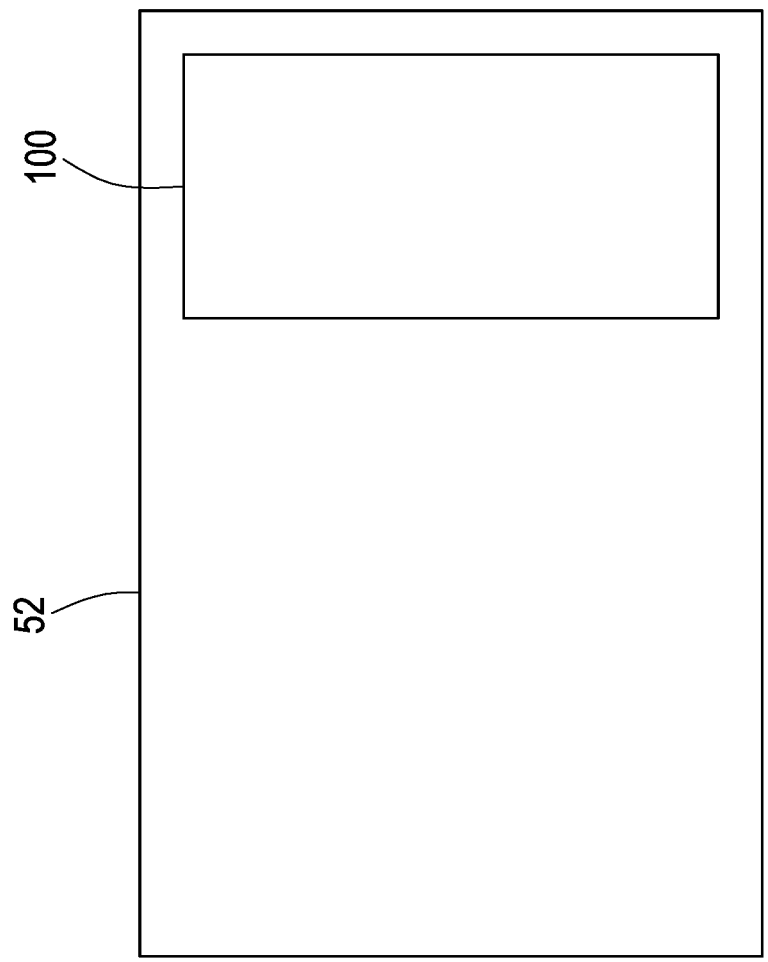
FIG. 1 is a schematic view of an electronic device according to an embodiment of the disclosure.
Figure 2:
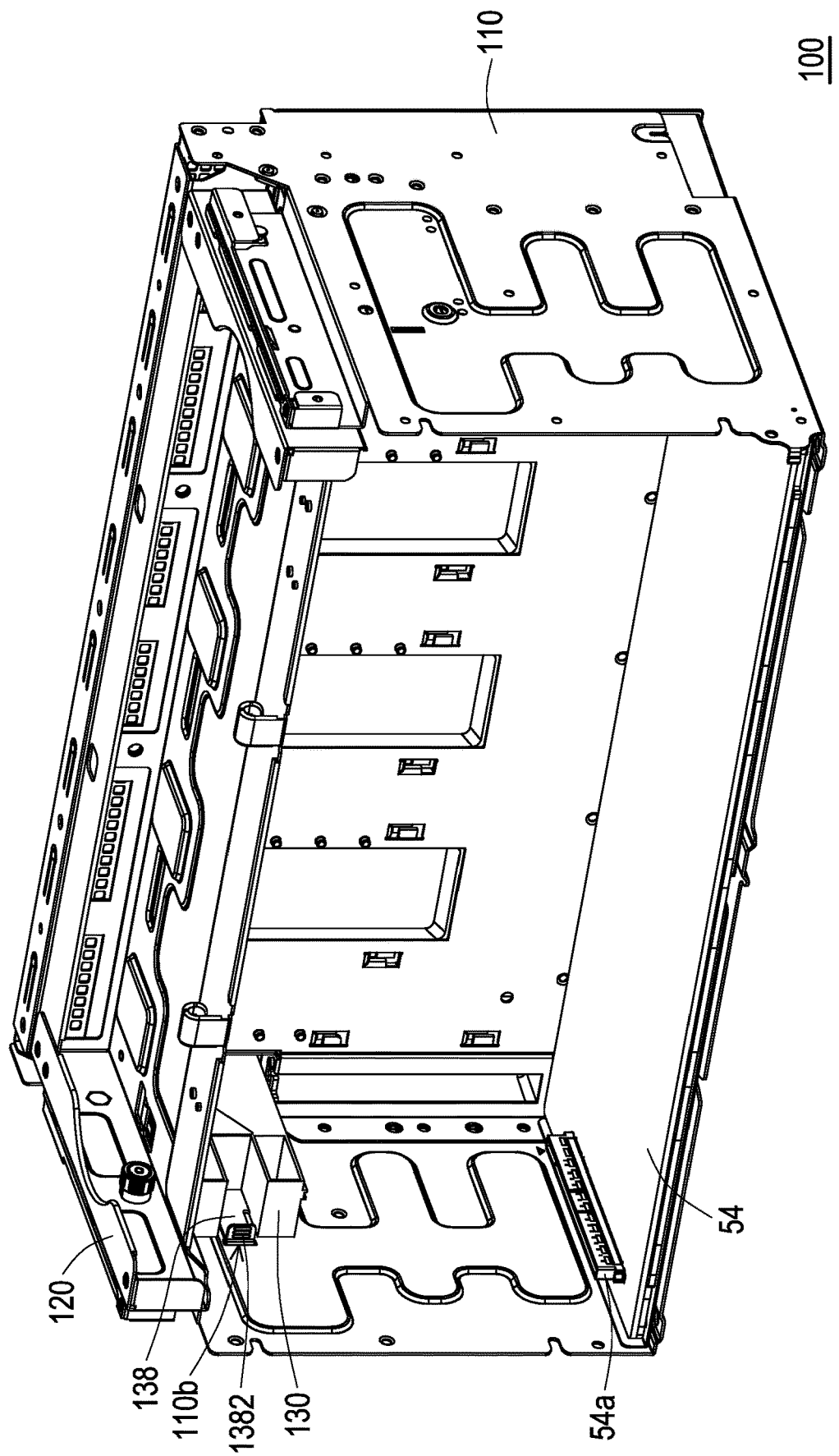
FIG. 2 is a perspective view of the carrying module of FIG. 1.

FIG. 1 is a schematic view of an electronic device according to an embodiment of the disclosure FIG. 2 is a perspective view of the carrying module of FIG. 1. Referring to FIG. 1 and FIG. 2, the electronic device 50 of this embodiment includes an electronic device main body 52 and a carrying module 100. The carrying module 100 is disposed in the electronic device main body 52 and is used to carry expansion cards or other types of functional assemblies. The specific assembly method of the functional assemblies is described in detail later. The electronic device 50 may be, for example, computer equipment, server equipment, etc., but is not limited thereto.

Figure 3:
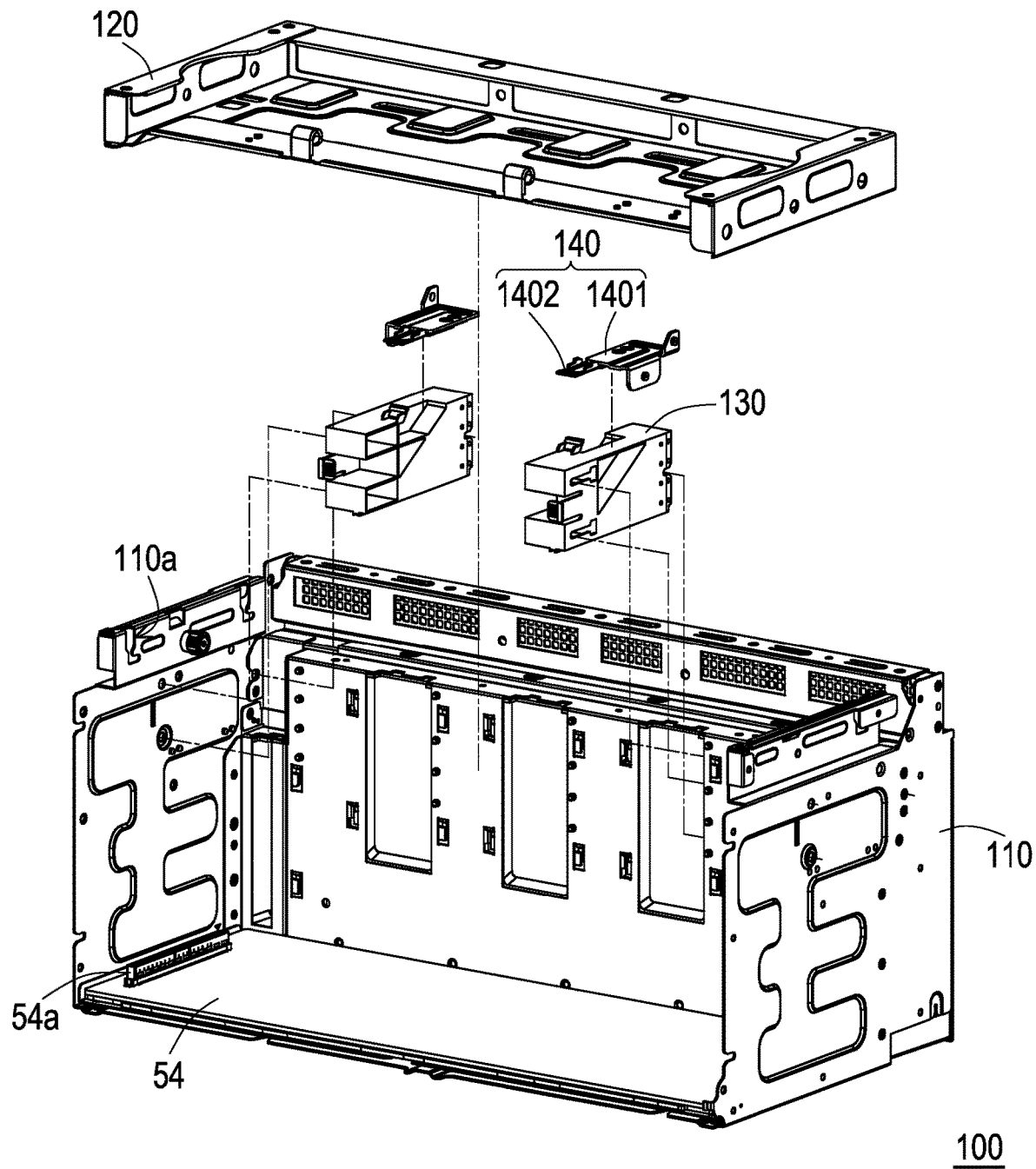
FIG. 3 is an exploded view of the carrying module of FIG. 2.
Figure 4:
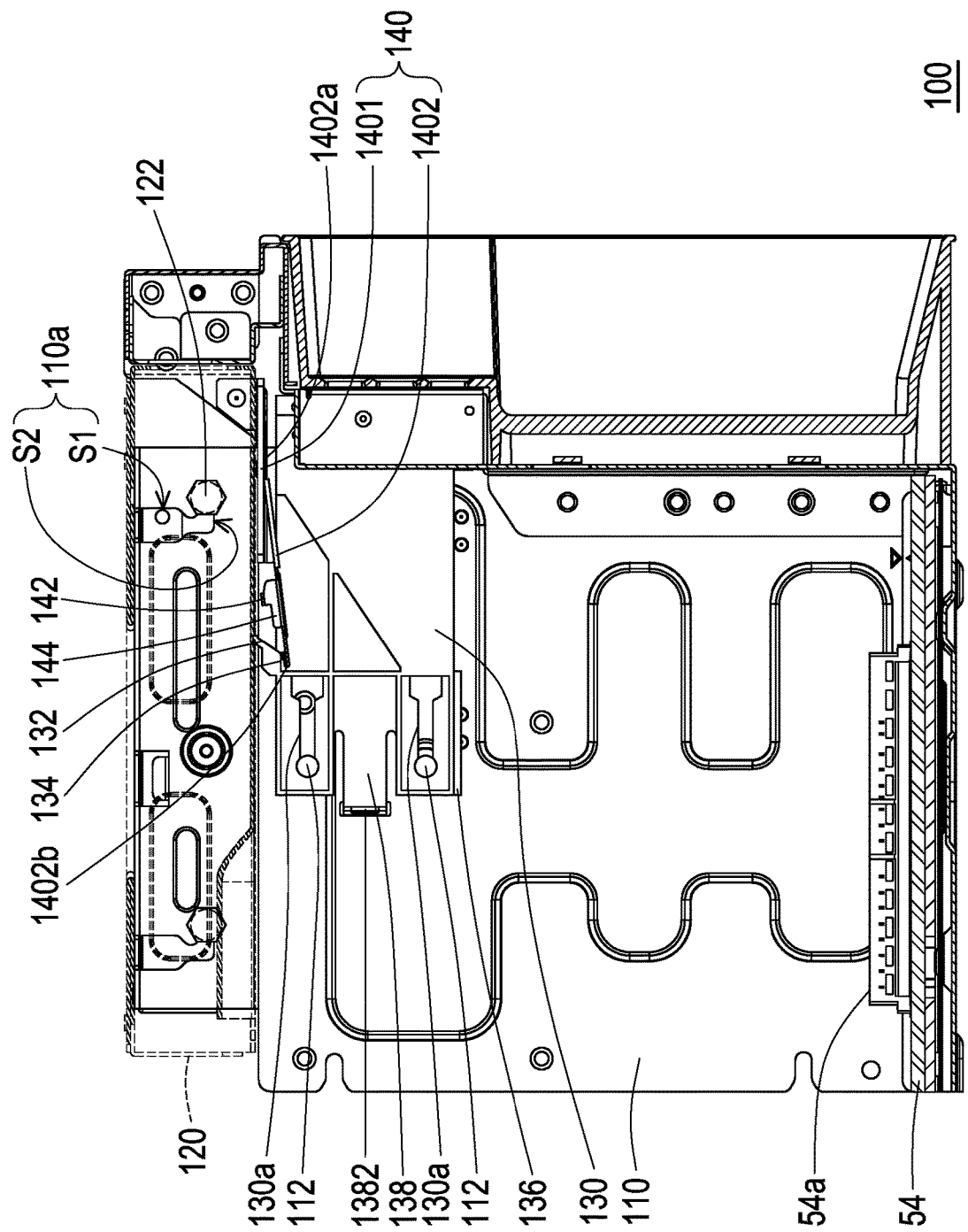
FIG. 4 is a partial side view of the carrying module of FIG. 2.
Figure 5:
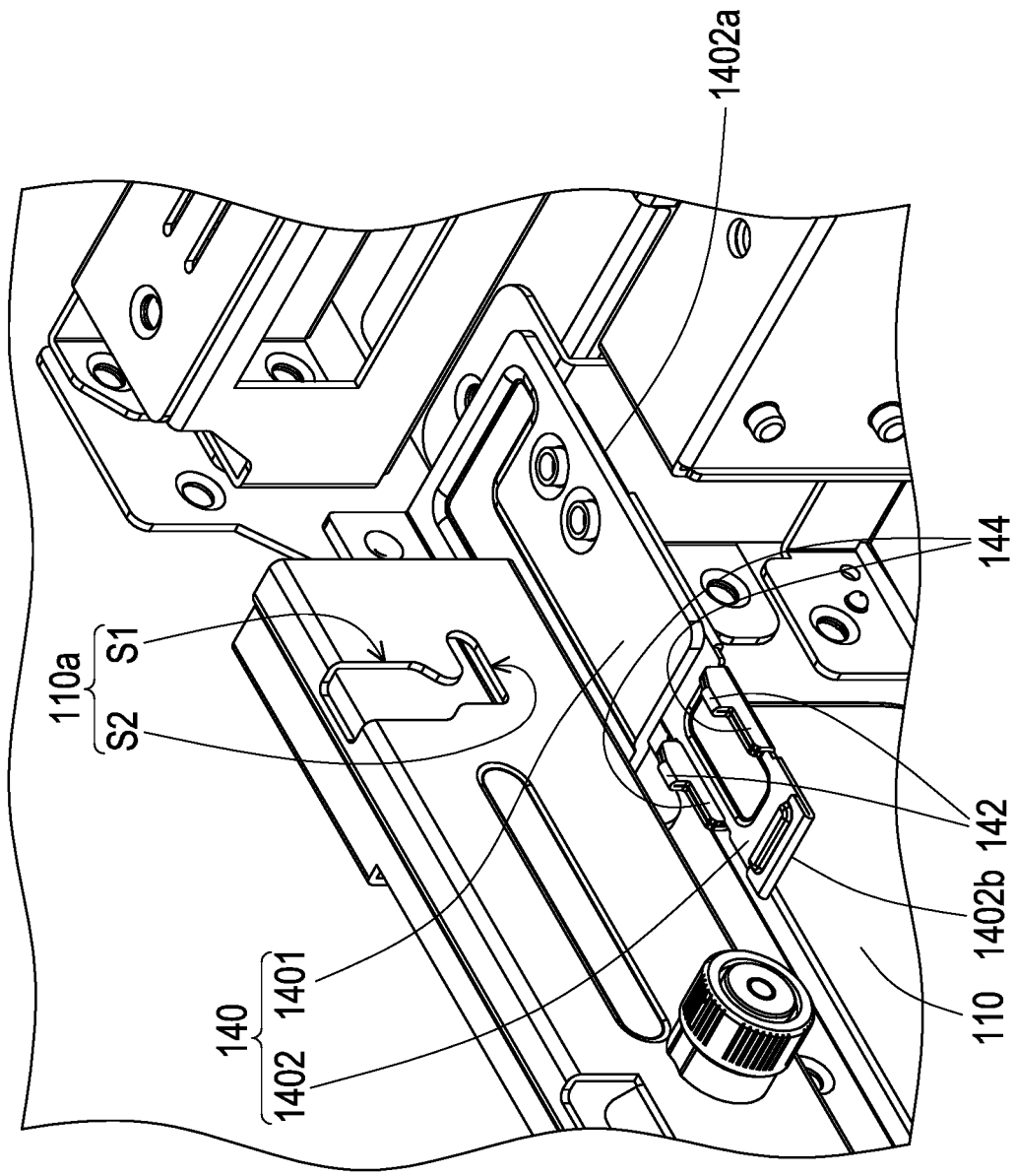
FIG. 5 is a partial perspective view of some of the components of the carrying module of FIG. 2.

FIG. 3 is an exploded view of the carrying module of FIG. 2. FIG. 4 is a partial side view of the carrying module of FIG. 2. FIG. 5 is a partial perspective view of some of the components of the carrying module of FIG. 2. Referring to FIG. 2 to FIG. 5, the carrying module 100 includes a main casing 110, a cover 120, and at least one assist assembly 130 (two are shown in FIG. 3). The main casing 110 is disposed in the electronic device main body 52 (as shown in FIG. 1). The cover 120 is detachably assembled to the main casing 110. The functional assembly 60 is, for example, an expansion card, which can be inserted into a slot 54a on a circuit board 54 in the main casing 110. The assist assembly 130 is, for example, a wind scooper and is disposed on the main casing 110. The carrying module 100 of this embodiment further includes at least one stop assembly 140 (two are shown in FIG. 3). The stop assembly 140 is disposed on the main casing 110 and has a stop portion 142.

Figure 6A:
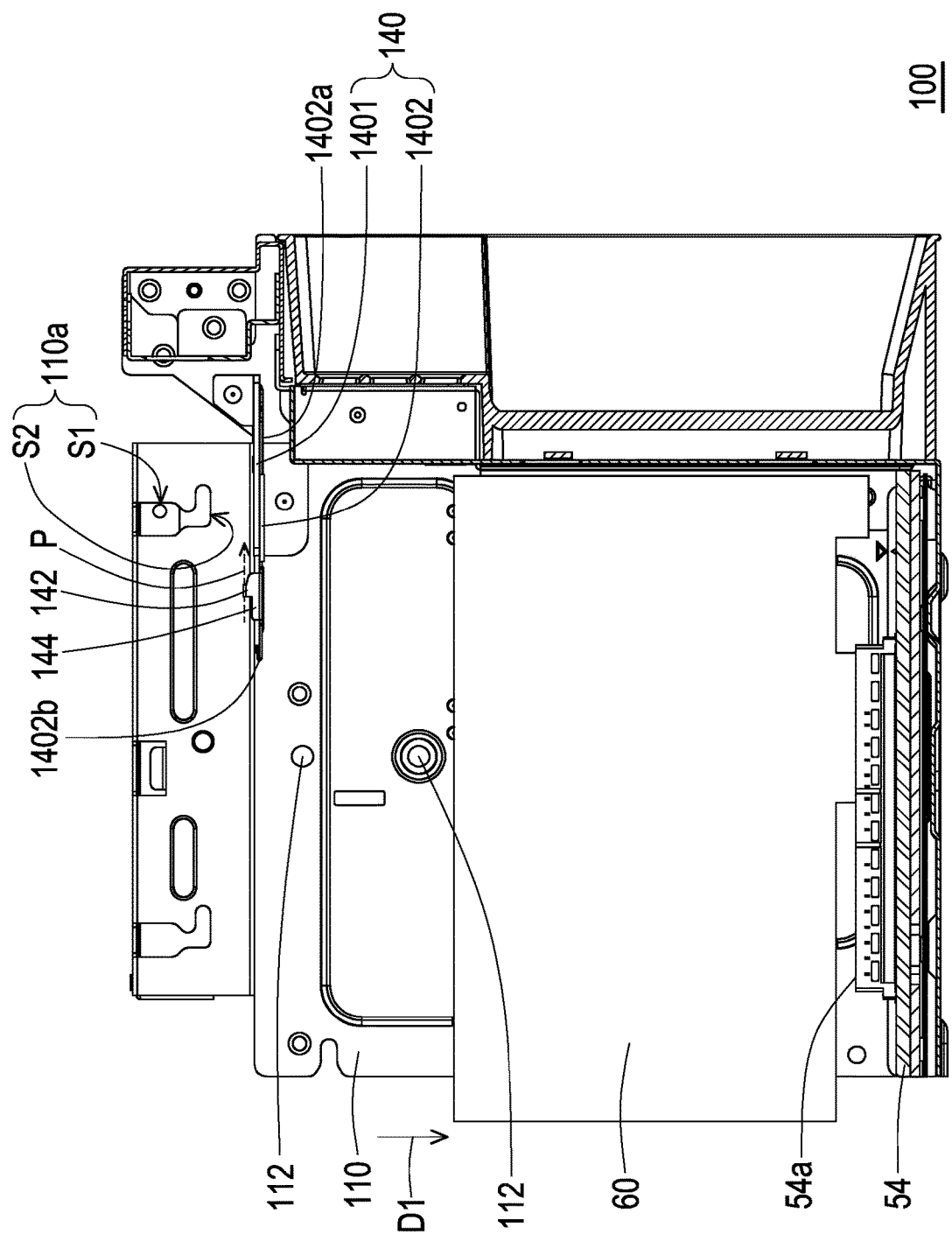
FIG. 6A to FIG. 6F are assembly flowcharts of the carrying module of FIG. 2.

FIG. 6A to FIG. 6F are assembly flowcharts of the carrying module of FIG. 2. As shown in FIG. 6A, the user may first insert a functional assembly 60 (expansion card) onto the circuit board 54 along an inserting direction D1. As shown in FIG. 6A, the assist assembly 130 (as shown in FIG. 4) has not been assembled at this time. The stop portion 142 of the stop assembly 140 is in a stopping mode and is located on an assembling path P of the cover 120 (as shown in FIG. 4). The stop portion 142 located on the assembling path P stops the cover 120 and prevents the cover 120 from being assembled.

Figure 6B:
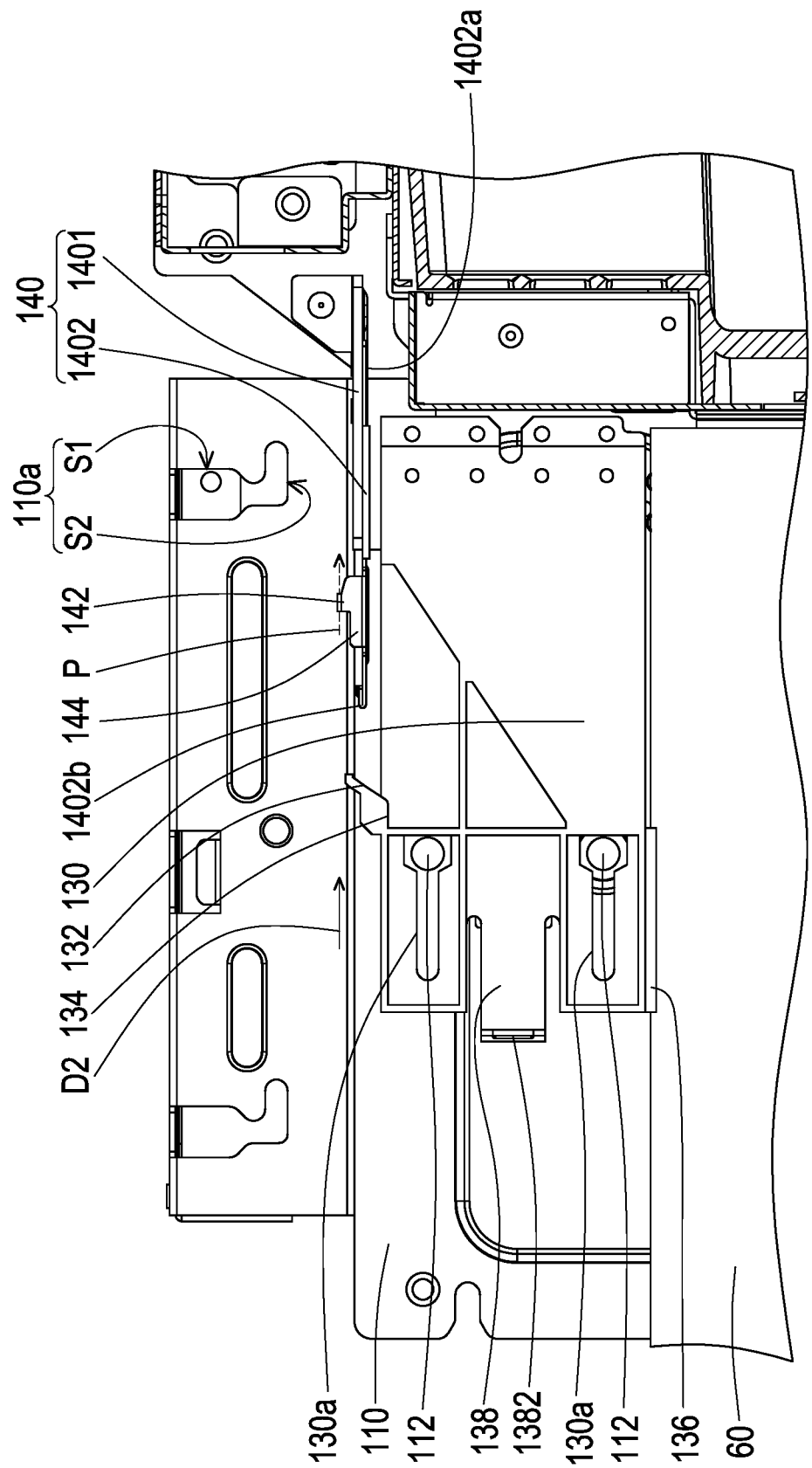
Figure 6C:
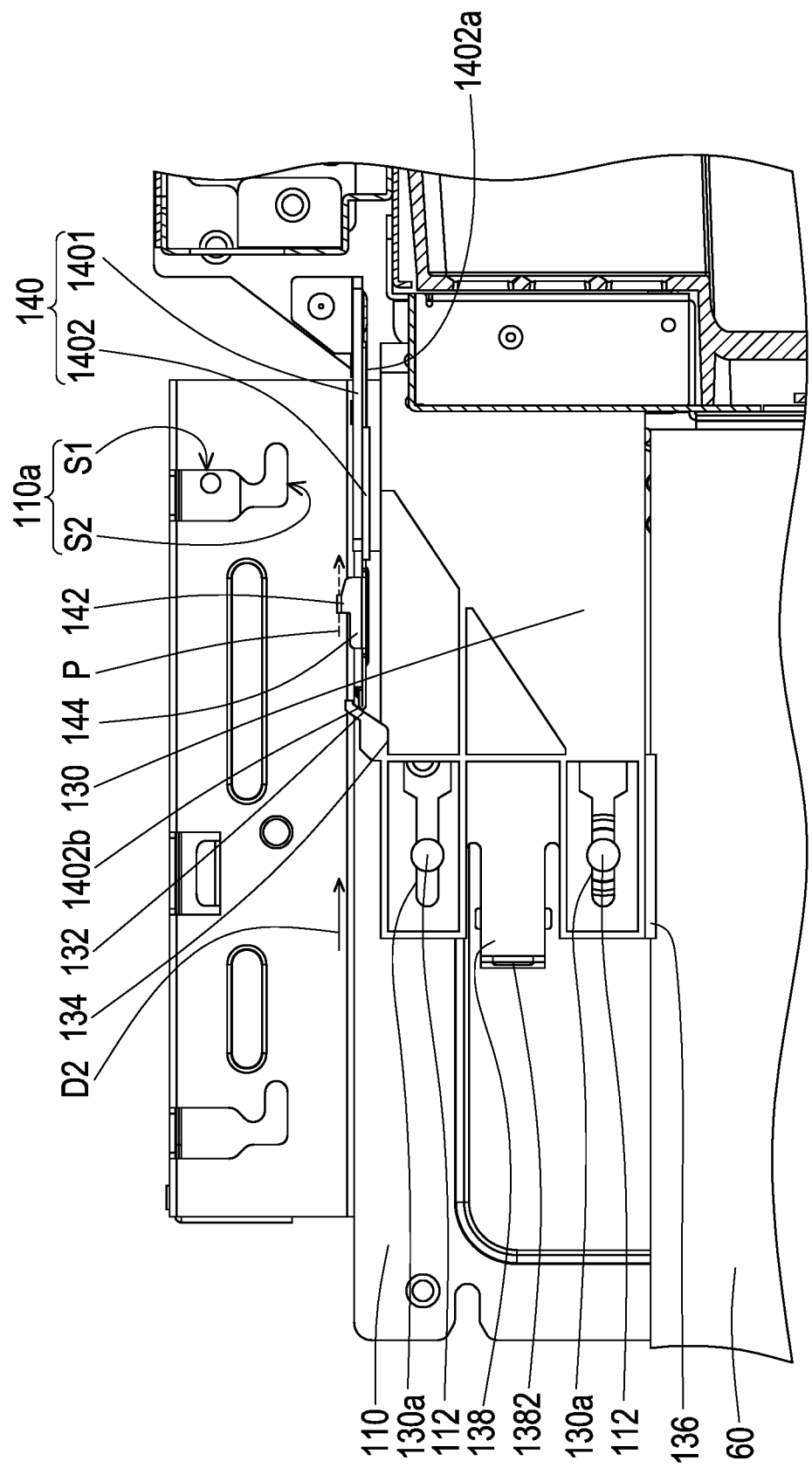
Figure 6D:
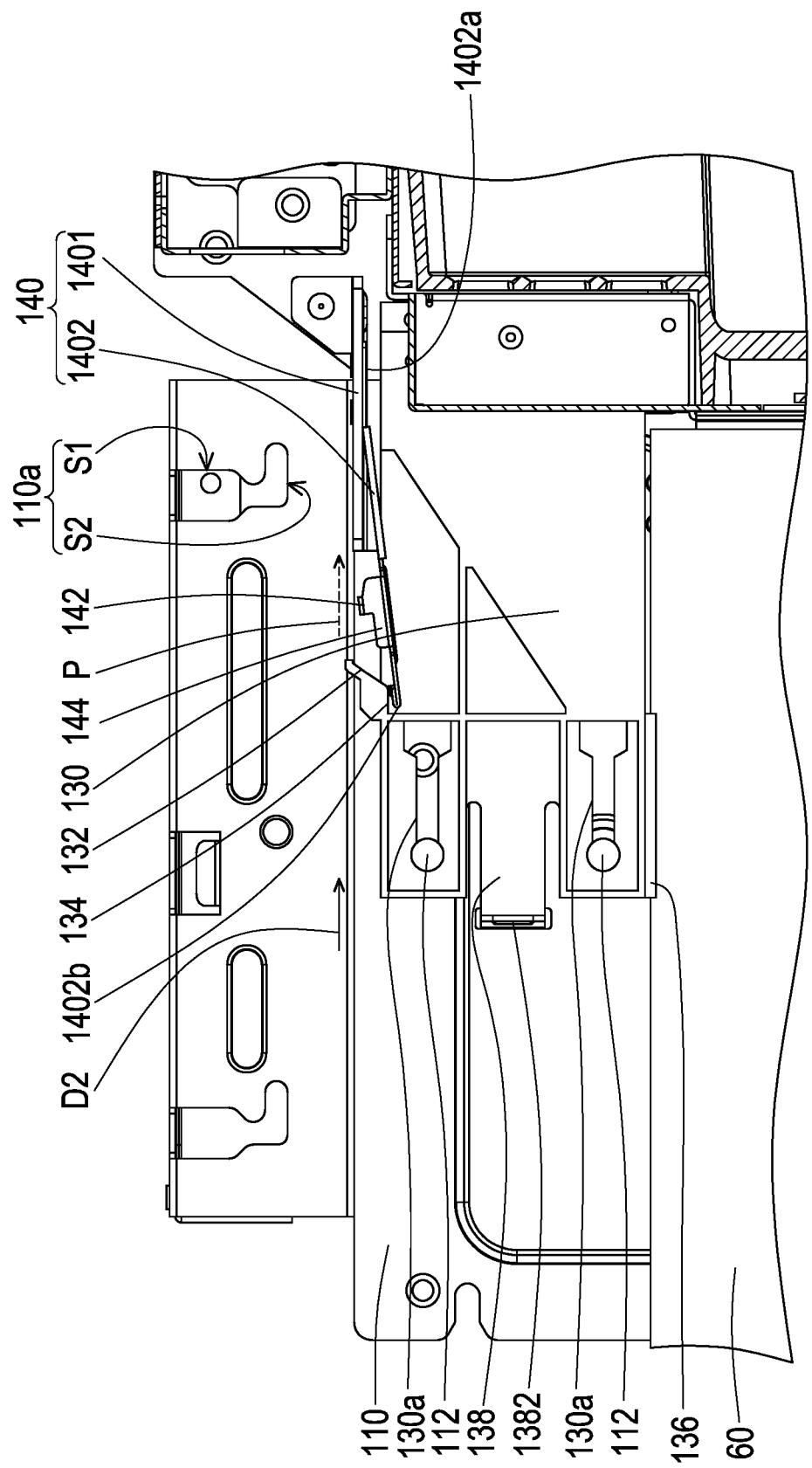
Figure 6E:
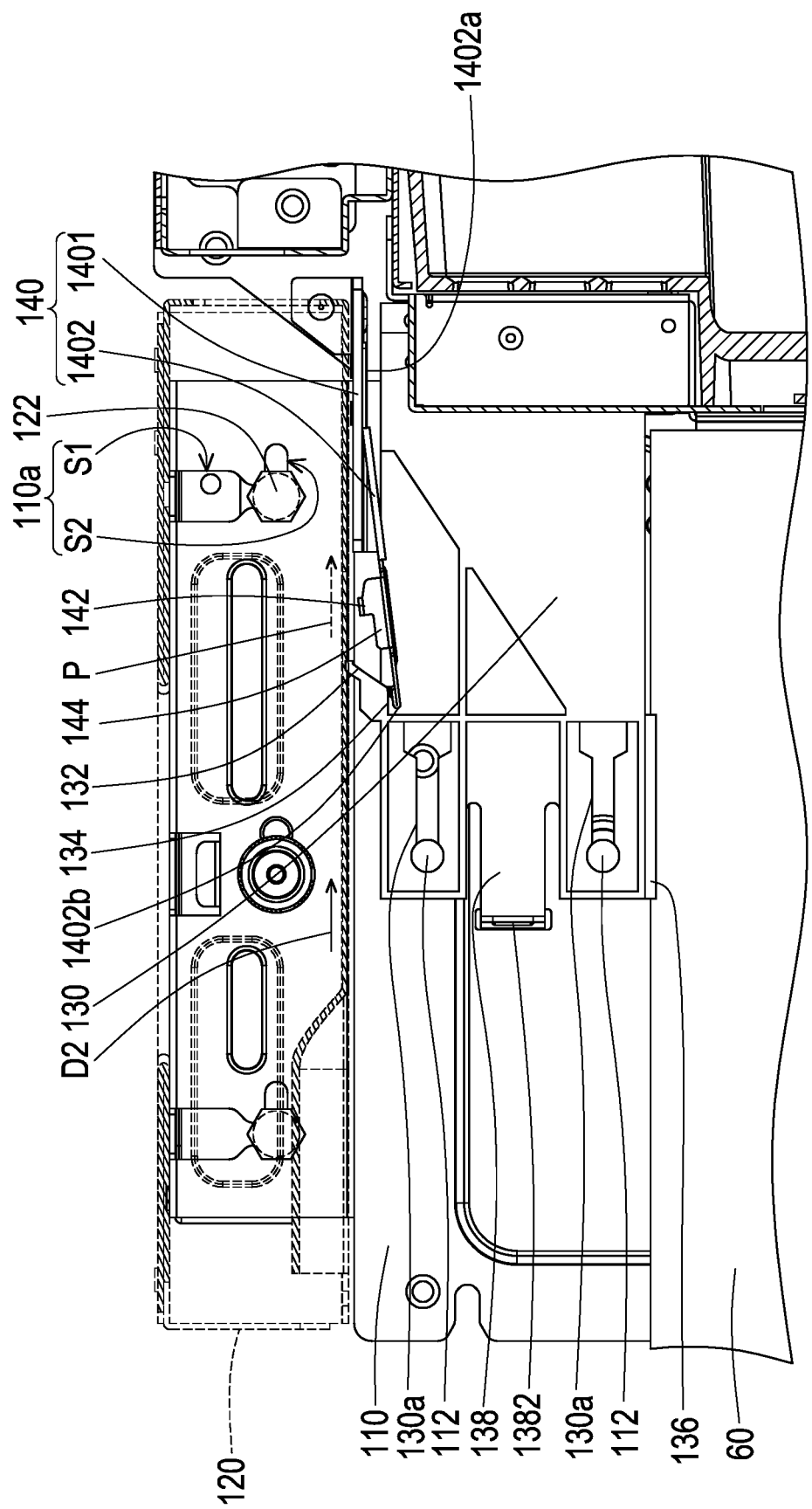
Figure 6F:
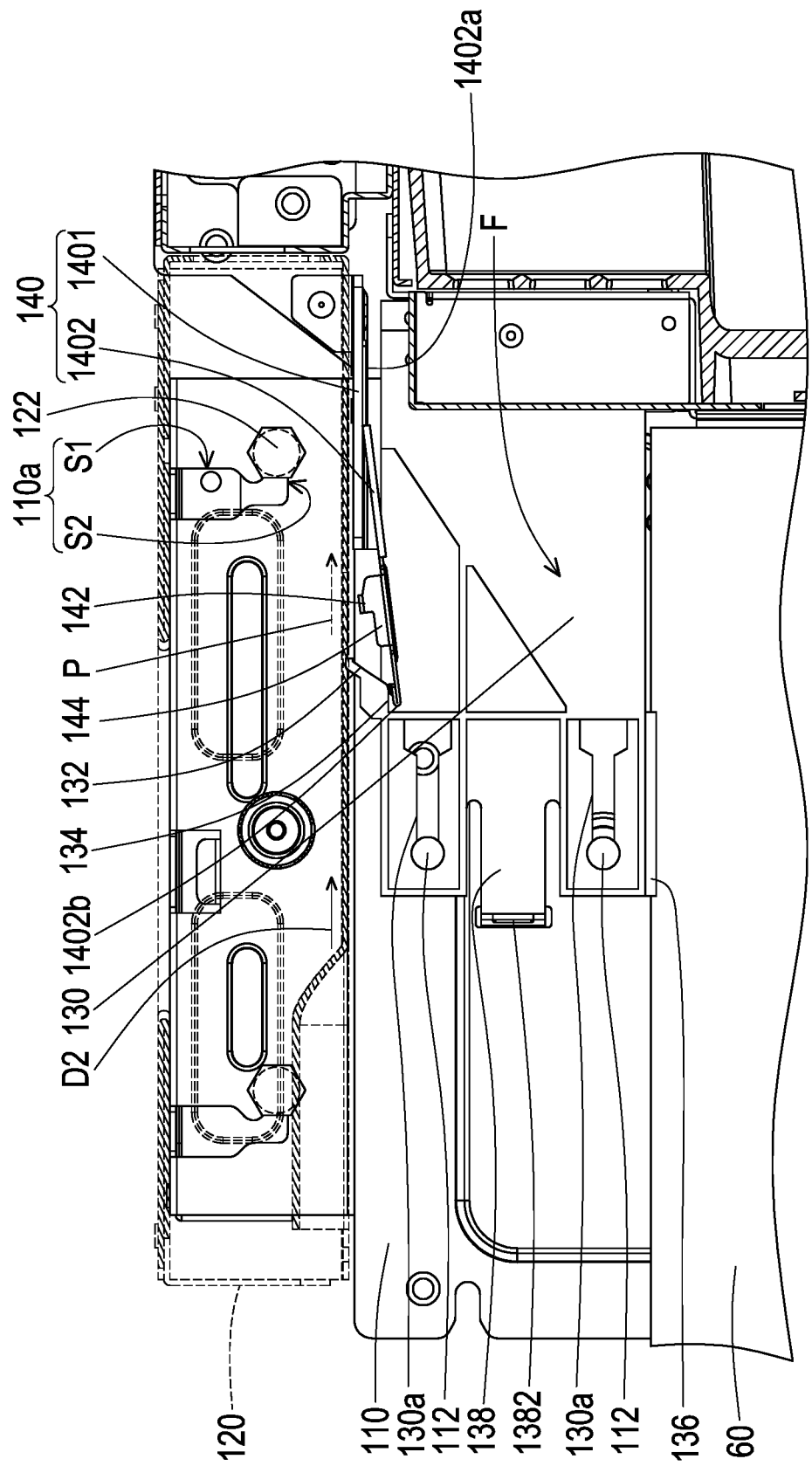

Next, the user may assemble the assist assembly 130 to the main casing 110 along an assembling direction D2 parallel to the assembling path P as shown in FIG. 6B to FIG. 6D. The assist assembly 130 assembled to the main casing 110 contacts and limits the stop portion 142 of the stop assembly 140 to a non-stopping mode as shown in FIG. 6D. The stop portion 142 in the non-stopping mode is away from the cover 120 and is not located on the assembling path P of the cover 120, so the assembly of the cover 120 is not prevented. Thus, the user may assemble the cover 120 to the main casing 110 as shown in FIG. 6E to FIG. 6F.

As described above, this embodiment adds a stop assembly 140 in the carrying module 100. Only if the assist assembly 130 is configured, the stop portion 142 of the stop assembly 140 is limited to a non-stopping mode by the assist assembly 130. Otherwise, the stop portion 142 of the stop assembly 140 is in a stopping mode and prevents the assembly of the cover 120. In this way, fool-proof effect is obtained. Users may avoid omitting the assembly of the assist assembly 130 due to negligence. Therefore, this ensures that the assist assembly 130 is located in the main casing 110 and guides the heat dissipation airflow F (as shown in FIG. 6F) to the functional assembly 60.

Figure 7:
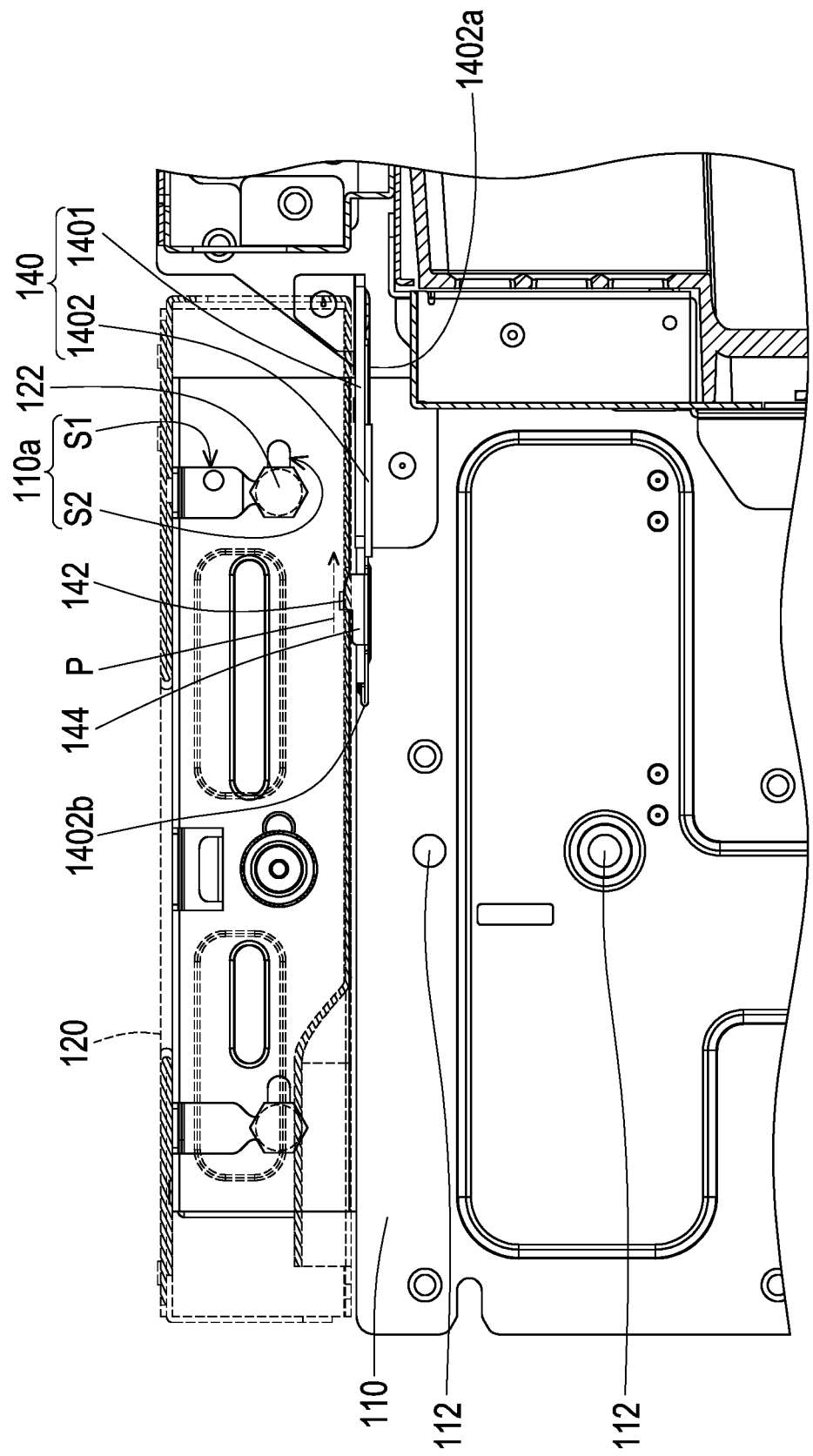
FIG. 7 illustrates that the stop assembly of FIG. 6A prevents the assembly of the cover.

FIG. 7 illustrates that the stop assembly of FIG. 6A prevents the assembly of the cover. Specifically, if the user assembles the cover 120 without the assist assembly 130 being configured, the stop portion 142 of the stop assembly 140 located on the assembling path P stops the cover 120 as shown in FIG. 7. Therefore, the user fails to complete the assembly of the cover 120.

In detail, the stop assembly 140 of this embodiment includes a frame body 1401 and an elastic piece 1402. The material of the frame body 1401 includes but not limited to cold rolled galvanized steel sheet (SGCC), and the material of the elastic piece 1402 includes but is not limited to stainless steel. The frame body 1401 is fixed on the main casing 110. A fixed end 1402a of the elastic piece 1402 is connected to the frame body 1401, while the other end is a free end 1402b. The two ends of the elastic piece 1402 are equivalent to an elastic piece of the stop assembly 140. The stop portion 142 is, for example, a folded wall on the elastic piece 1402 and is located in the elastic piece. In some embodiments, the stop portion 142 is adjacent to the free end 1402b.

On the other hand, the assist assembly 130 of this embodiment has a guiding portion 132 and a limiting portion 134. The guiding portion 132 is adjacent to the limiting portion 134. The guiding portion 132 is, for example, a guiding slope, which is inclined to the assembling direction D2. As shown in FIG. 6B to FIG. 6D, during the process of assembling the assist assembly 130 to the main casing 110 along the assembling direction D2 guided by a guide pin 112 of the main casing 110 through a guiding slot 130a thereof, the guiding portion 132 resists the elastic force of the elastic piece 1402 by the guiding slope and pushes the elastic piece 1402 away from the assembling path P, so that the stop portion 142 in the stopping mode is guided by the guiding slope to the non-stopping mode as shown in FIG. 6D and is limited by the limiting portion 134. That is, the guiding portion 132 is adapted to guide the stop portion 142 to move to the limiting portion 134. The stop portion 142 is limited to the limiting portion 134 and away from the assembling path P of the cover 120.

In this embodiment, the main casing 110 has at least one guiding slot 110a (two are shown), and each of the guiding slot 110a has a first extension section S1 and a second extension section S2 that are perpendicular to each other. The second extension section S2 is parallel to the assembling path P of the cover 120. The cover 120 has at least one guide pin 122 (two are shown). The guide pin 122 is adapted to move within the guiding slot 110a and guide the cover 120 to move to a predetermined position to complete the assembly. In some embodiments, the guide pin 122 guides the cover 120 to move toward the functional assembly along the inserting direction D1 to the position shown in FIG. 6E. At this moment, the guide pin 122 moves in a direction of the first extension section S1 that parallel to the inserting direction D1. Next, the guide pin 122 guides the cover 120 to move along the assembling direction D2. At this moment, the guide pin 122 moves parallel to the second extension section S2. The cover 120 moves laterally from the position shown in FIG. 6E to the position shown in FIG. 6F, thereby completing the assembly of the cover 120.

Figure 8:
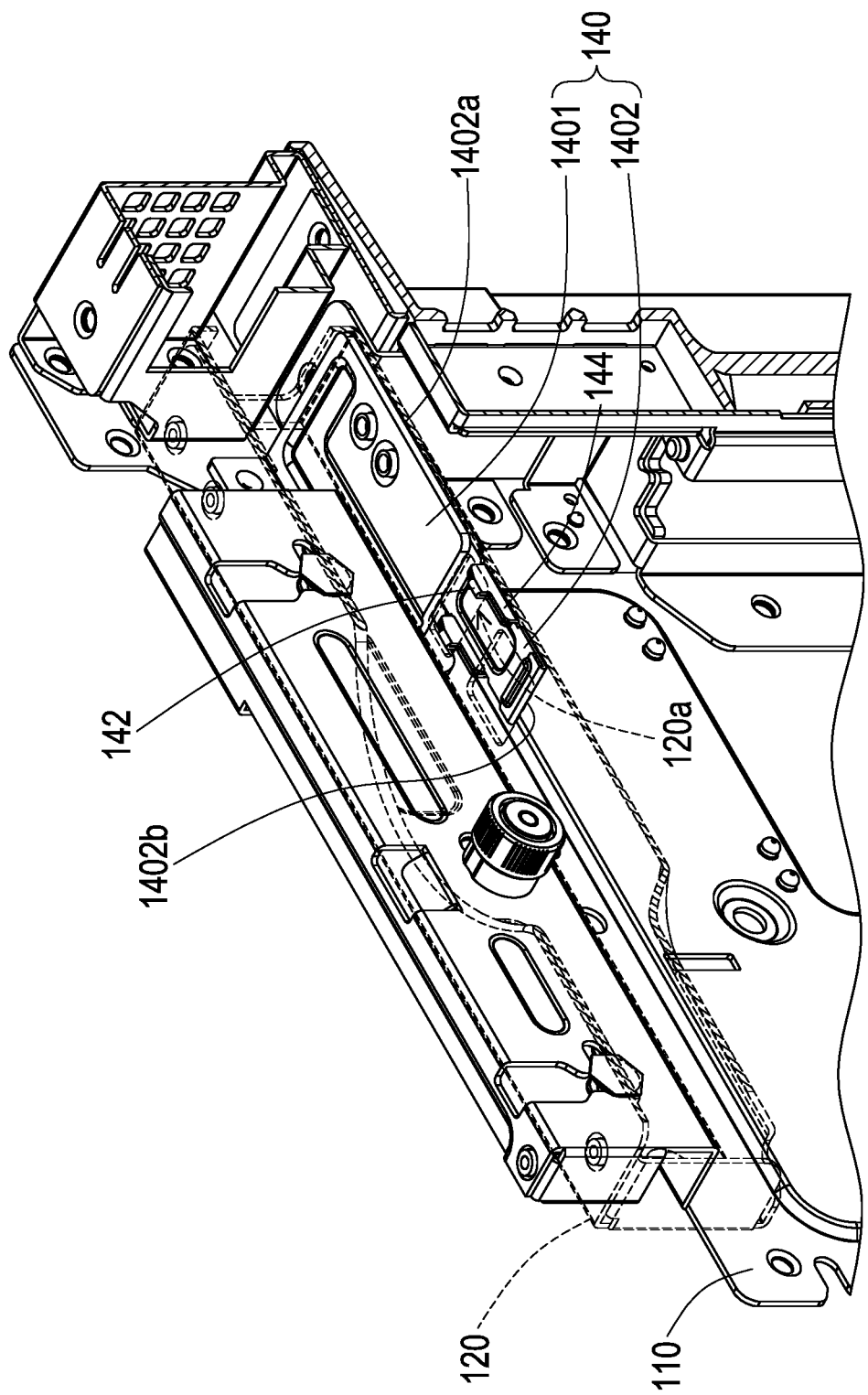
FIG. 8 is a partial perspective view of the carrying module of FIG. 7.

FIG. 8 is a partial perspective view of the carrying module of FIG. 7. Referring to FIG. 8, the cover 120 of this embodiment has an opening slot 120a. When the assist assembly 130 is not assembled, the stop portion 142 in the stopping mode is adapted to extend into the opening slot 120a as shown in FIG. 8 to stop the cover 120. In addition, the stop assembly 140 of this embodiment has a support portion 144. The support portion 144 is adjacent to the stop portion 142 and is disposed between the stop portion 142 and the free end 1402b. When the stop portion 142 extends into the opening slot 120a of the cover 120, as shown in FIG. 8, the support portion 144 supports the cover 120 to prevent the elastic piece 1402 from being deformed due to the force exerted by the user on the cover 120, causing the stop portion 142 to leave the assembling path P.

Figure 9:
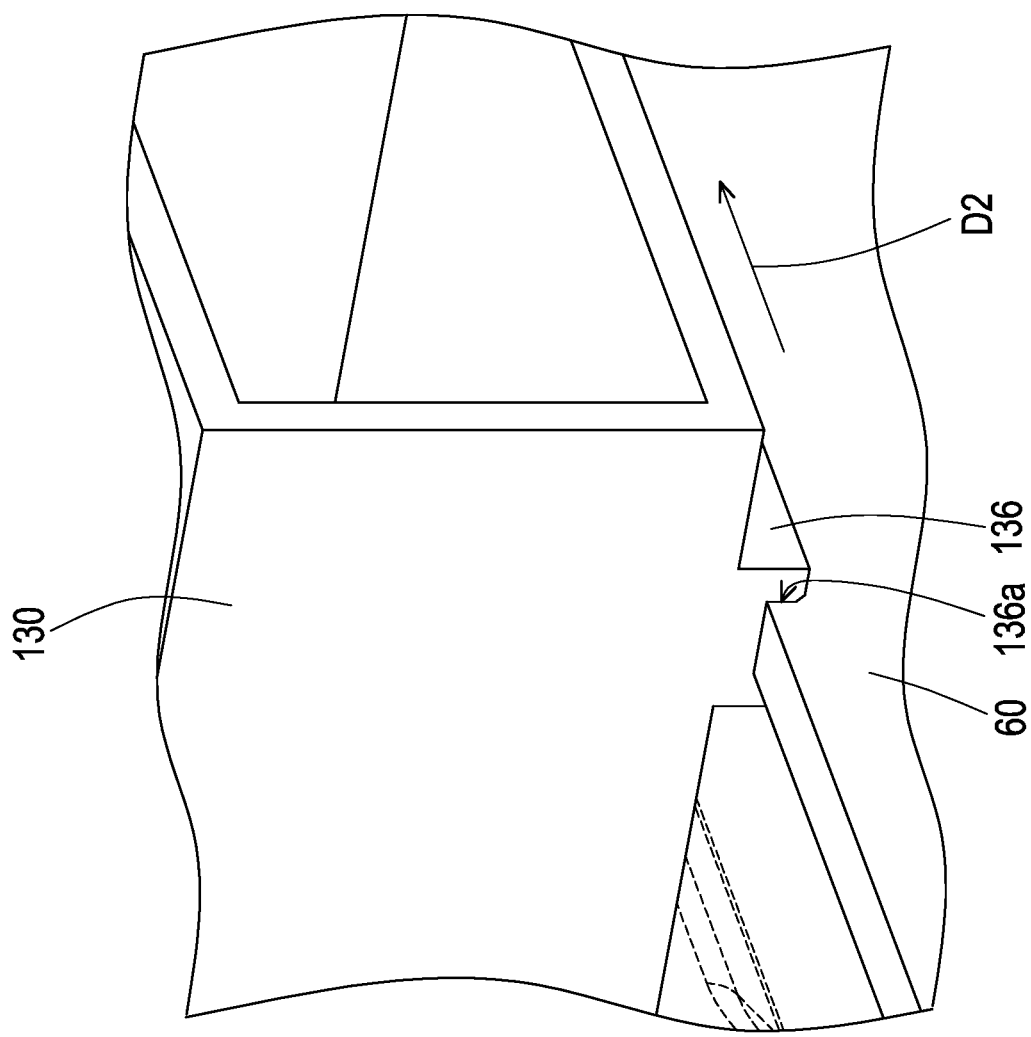
FIG. 9 is a partial perspective view of the carrying module and the functional assembly of FIG. 2.

FIG. 9 is a partial perspective view of the carrying module and the functional assembly of FIG. 2. Referring to FIG. 6F and FIG. 9, the assist assembly 130 of this embodiment has a pressing portion 136. The pressing portion 136 presses the functional assembly 60 against the main casing 110, so that the functional assembly 60 is firmly inserted onto the circuit board 54 in the main casing 110 (as shown in FIG. 6A). The pressing portion 136 is provided with a recessed slot 136a as shown in FIG. 9. An upper edge of the functional assembly 60 is adapted to match with the recessed slot 136a, so that the assist assembly 130 is smoothly assembled along the assembling direction D2 by the guidance of the recessed slot 136a. Also, the assist assembly 130 is accurately aligned with the functional assembly 60 and presses the functional assembly 60.

Figure 10:
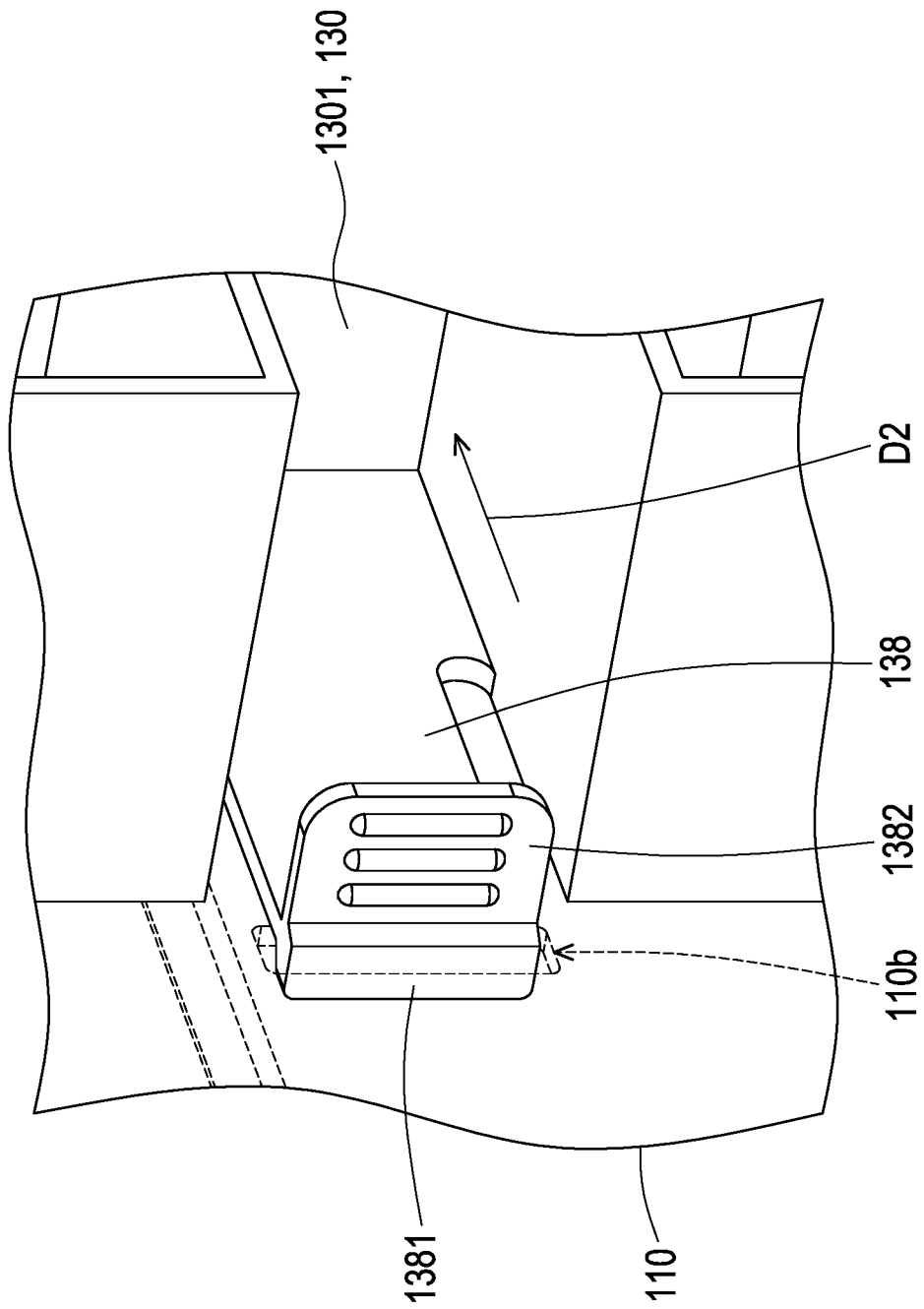
FIG. 10 is a partial perspective view of the carrying module of FIG. 2.

FIG. 10 is a partial perspective view of the carrying module of FIG. 2. Referring to FIG. 10, the assist assembly 130 of this embodiment has an elastic arm 138. The elastic arm 138 extends outwardly from an assist assembly body 1301. At the end of the elastic arm 138 distant from the assist assembly body 1301, there is an engaging portion 1381 and a stressed portion 1382 adjacent to the engaging portion 1381. When the assist assembly 130 is assembled in place as shown in FIG. 6F, the engaging portion 1381 is engaged with an engaging slot 110b of the main casing 110. That is, the engaging portion 1381 and the engaging slot 110b cooperate to position the assist assembly 130 on the main casing 110. When the user intends to disassemble the assist assembly 130, the stressed portion 1382 can be pulled to make the engaging portion 1381 disengage from the engaging slot 110b, such that the assist assembly 130 is disassembled along the direction opposite to the assembling direction D2.

The disclosure does not limit the types of functional assembly and assist assembly, which are exemplified below.

Figure 11A:
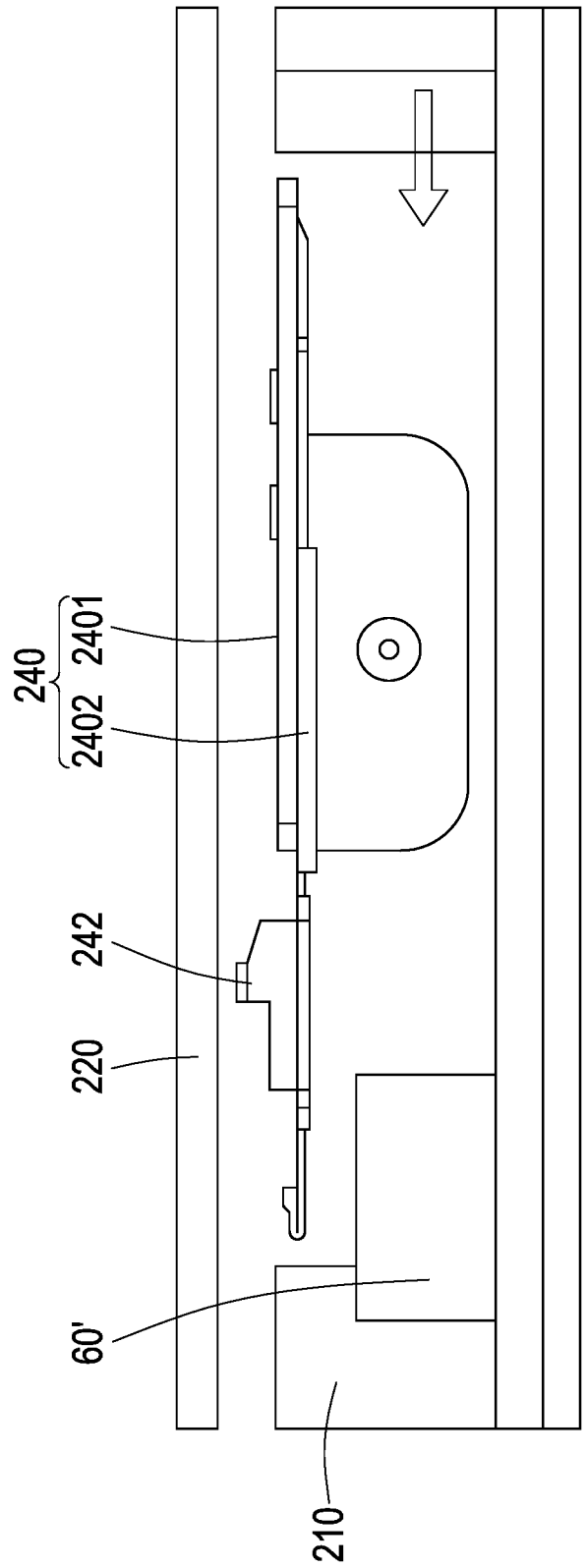
FIG. 11A and FIG. 11B are assembly flowcharts of a carrying module according to another embodiment of the disclosure.
Figure 11B:
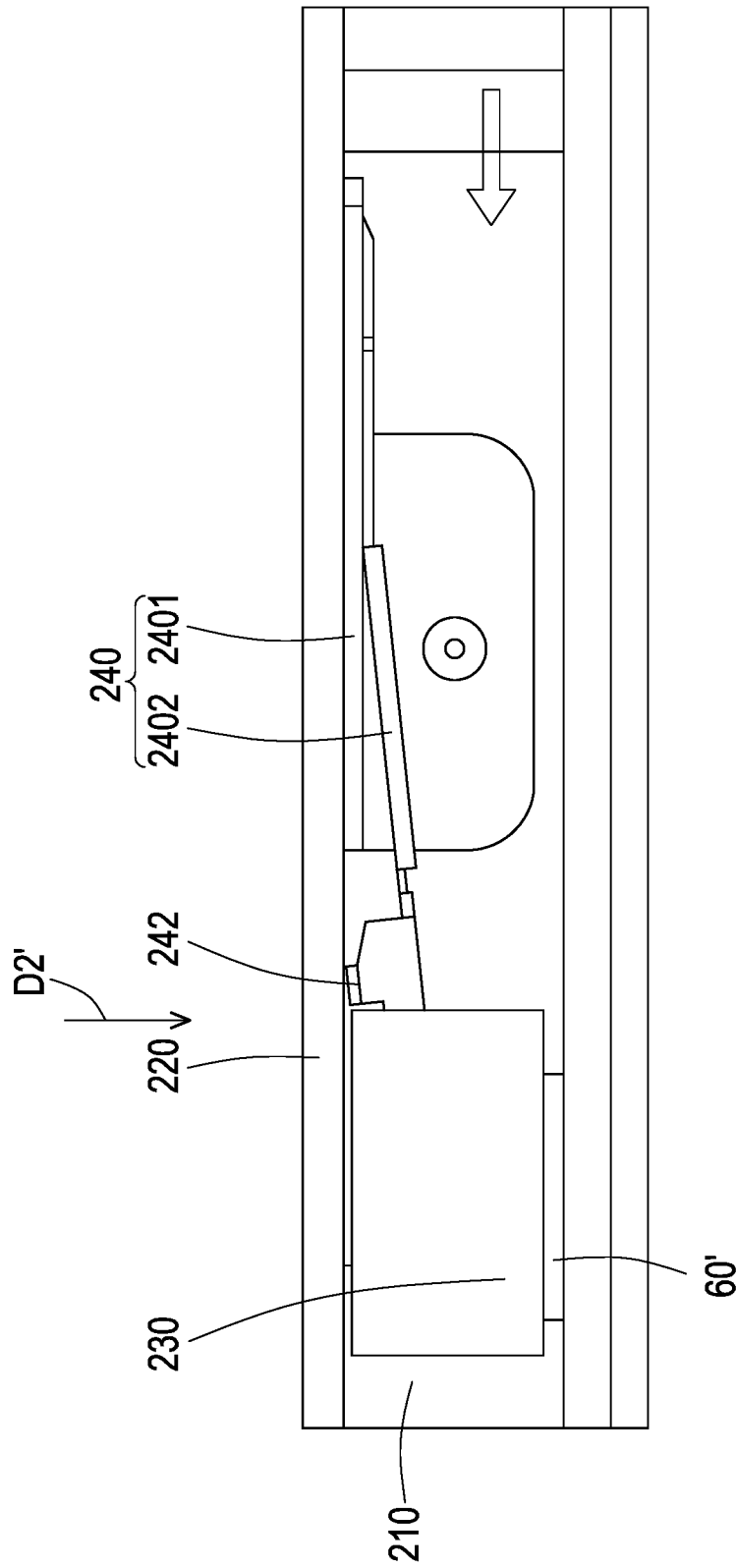

FIG. 11A and FIG. 11B are assembly flowcharts of a carrying module according to another embodiment of the disclosure. Referring to FIG. 11A and FIG. 11B, the disposition and function of the main casing 210, the cover 220, the stop assembly 240, the frame body 2401, the elastic piece 2402, and the stop portion 242 of the carrying module 200 in this embodiment are the same or similar to the disposition and function of the main casing 110, the cover 120, the stop assembly 140, the frame body 1401, the elastic piece 1402, and the stop portion 142 of the previous embodiment, and details are not described herein again. The main difference between the carrying module 200 and the carrying module 100 is that the functional assembly 60' of the carrying module 200 is a set of heat dissipation fins or a memory assembly. When the assist assembly 230 is assembled to the main casing 210 along the assembling direction D2', the assist assembly 230 resists the elastic force of the elastic piece 2402 of the stop assembly 240 and pushes against the elastic piece 2402. Hence, the stop portion 242 moves away from a stopping position to a non-stopping position, so that the cover 210 is assembled smoothly.

Figure 12A:
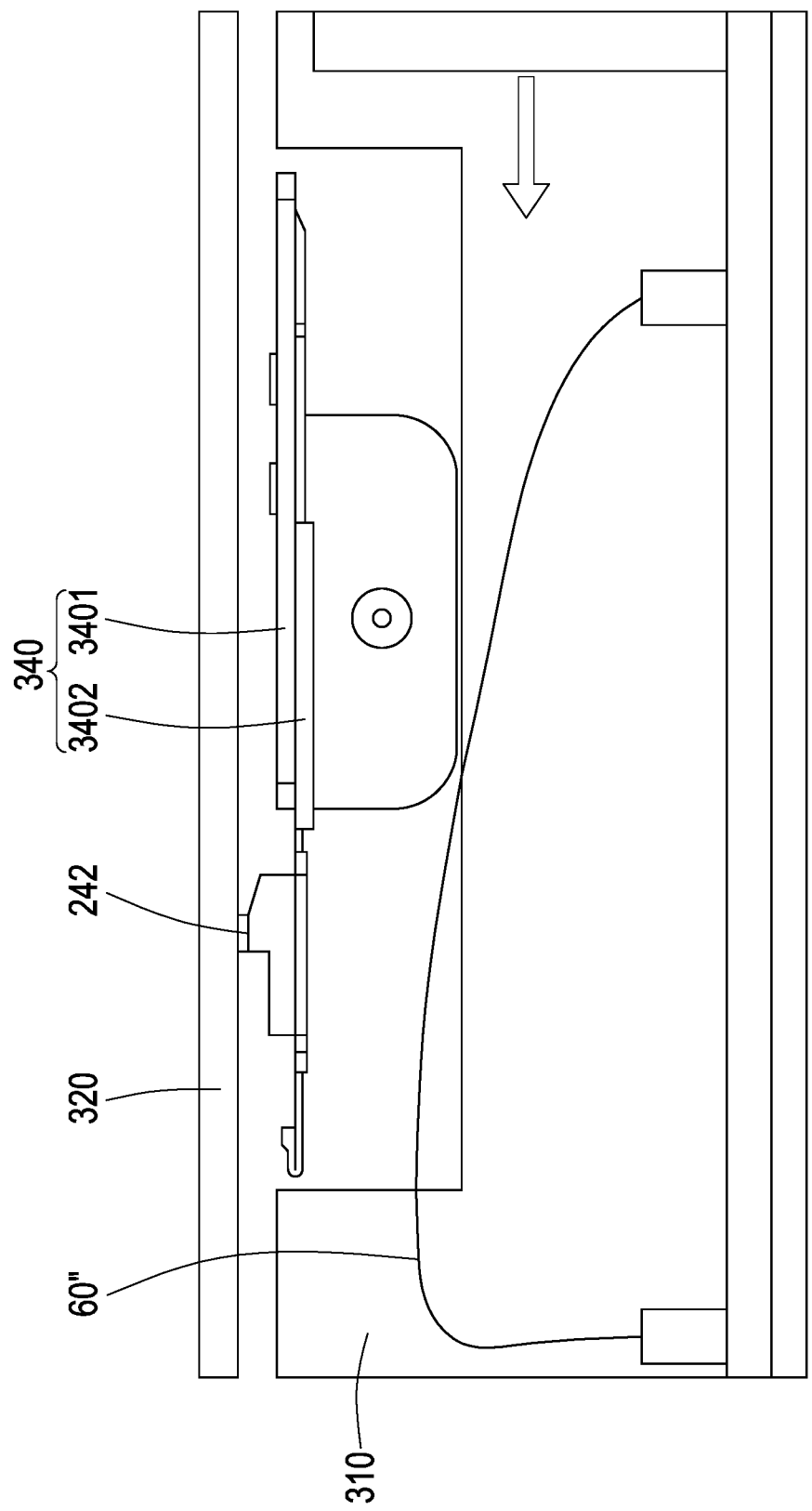
FIG. 12A and FIG. 12B are assembly flowcharts of a carrying module according to another embodiment of the disclosure.
Figure 12B:
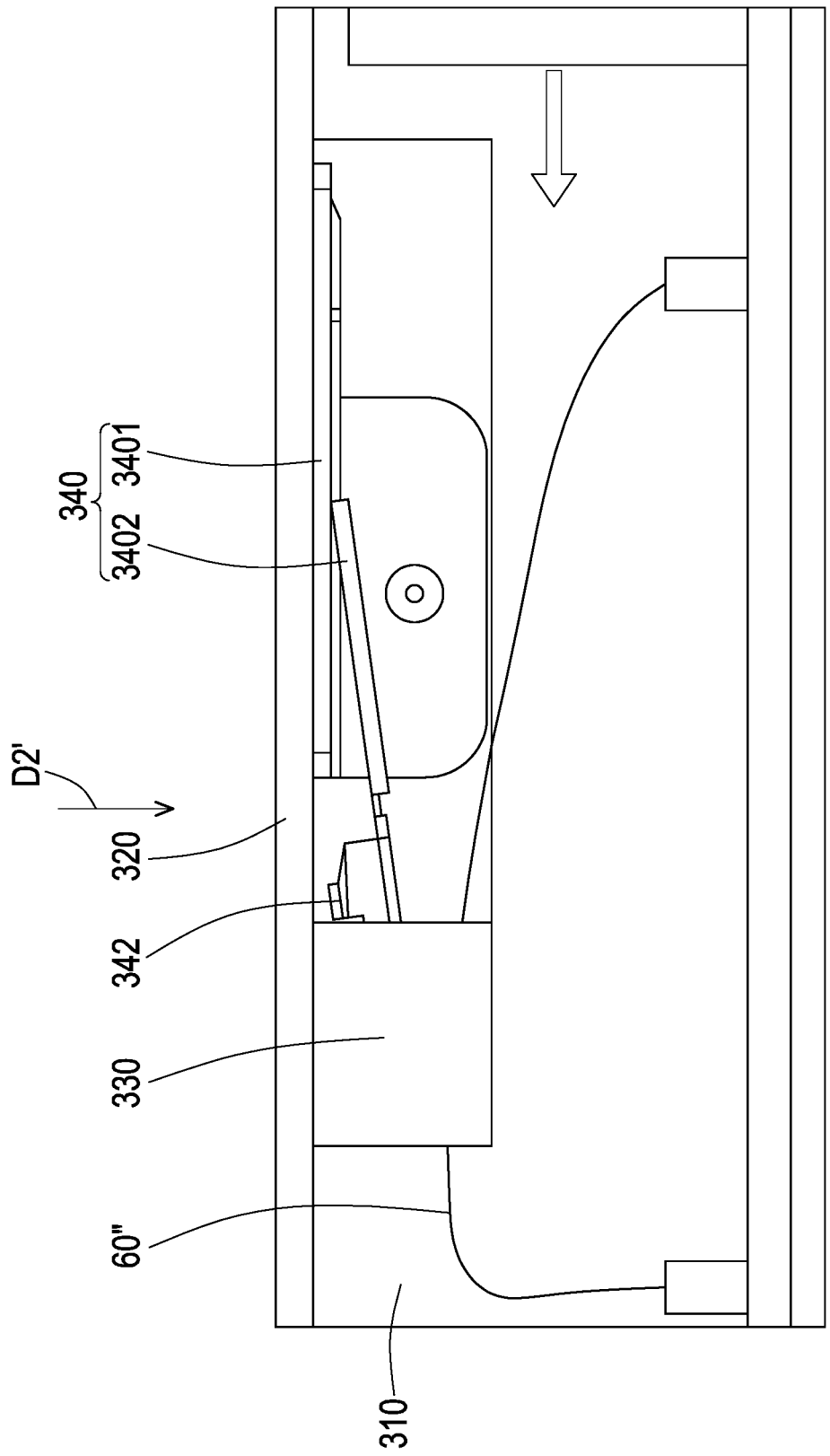

FIG. 12A and FIG. 12B are assembly flowcharts of a carrying module according to another embodiment of the disclosure. Referring to FIG. 12A and FIG. 12B, the disposition and function of the main casing 310, the cover 320, the stop assembly 340, the frame body 3401, the elastic piece 3402, and the stop portion 342 of the carrying module 300 in this embodiment are the same or similar to the disposition and function of the main casing 110, the cover 120, the stop assembly 140, the frame body 1401, the elastic piece 1402, and the stop portion 142 of the previous embodiment, and details are not described herein again. The main difference between the carrying module 300 and the carrying module 100 is that the functional assembly 60" of the carrying module 300 is a cable. The assist assembly 330 is a cable clip that manages the cable (functional assembly 60") as shown in FIG. 12B. When the assist assembly 330 is assembled to the main casing 310 along the assembling direction D2', the assist assembly 330 resists the elastic force of the elastic piece 3402 of the stop assembly 340 and pushes against the elastic piece 3402. Hence, the stop portion 342 moves away from a stopping position to a non-stopping position, so that the cover 310 is assembled smoothly.

To sum up, the disclosure adds a stop assembly in the carrying module. Only if the assist assembly is configured, the stop portion of the stop assembly is limited to a non-stopping mode by the assist assembly. Otherwise, the stop portion of the stop assembly is in a stopping mode and prevents the assembly of the cover. In this way, fool-proof effect is obtained. Users may avoid omitting the assembly of the assist assembly due to negligence.

What is claimed is:

1. A carrying module, configured to carry a functional assembly, comprising:
   a main casing;
   a cover, detachably assembled to the main casing;
   a stop assembly, disposed on the main casing and having a stop portion, the cover is stopped by the stop portion on an assembling path of the cover selectively; and
   an assist assembly, disposed on the main casing and contacting the stop assembly, wherein when the assist assembly contacts the stop assembly, the stop portion is away from the assembling path of the cover.

2. The carrying module according to claim 1, further comprising a functional assembly, the functional assembly is pressed by the assist assembly against the main casing, wherein the functional assembly is an expansion card, a set of heat dissipation fins, a memory assembly, or a cable, and the assist assembly is a wind scooper or a cable clip.

3. The carrying module according to claim 1, wherein the stop assembly has an elastic piece, and the stop portion is located on the elastic piece.

4. The carrying module according to claim 1, wherein the assist assembly has a guiding portion and a limiting portion, the guiding portion is adjacent to the limiting portion, the stop portion of the stop assembly is guided by the guiding portion to move toward the limiting portion, and the stop portion is limited to the limiting portion away from the assembling path of the cover.

5. The carrying module according to claim 2, wherein the assist assembly has a pressing portion, and the pressing portion presses the functional assembly against the main casing.

6. The carrying module according to claim 1, wherein the main casing has a guiding slot, the guiding slot has a first extension section and a second extension section that are perpendicular to each other, the cover has a guide pin, and the guide pin is moved within the guiding slot.

7. The carrying module according to claim 6, wherein the second extension section is parallel to the assembling path of the cover.

8. The carrying module according to claim 1, wherein the cover has an opening slot, and when the stop portion extends into the opening slot, the cover is stopped by the stop portion.

9. The carrying module according to claim 8, wherein the stop assembly has a support portion, the support portion is adjacent to the stop portion, and when the stop portion extends into the opening slot, the support portion supports the cover.

10. The carrying module according to claim 1, wherein the assist assembly has an engaging portion, the main casing has an engaging slot, and the engaging portion and the engaging slot cooperate to position the assist assembly on the main casing.

11. An electronic device, configured to carry a functional assembly, comprising:
   an electronic device main body; and
   a carrying module, comprising:
      a main casing, disposed in the electronic device main body;
      a cover, detachably assembled to the main casing;
      a stop assembly, disposed on the main casing and having a stop portion, wherein the cover is stopped by the stop portion on an assembling path of the cover selectively; and
      an assist assembly, disposed on the main casing and contacting the stop assembly, wherein when the assist assembly contacts the stop assembly, the stop portion is away from the assembling path of the cover.

12. The electronic device according to claim 11, further comprising a functional assembly, the functional assembly is pressed by the assist assembly against the main casing, wherein the functional assembly is an expansion card, a set of heat dissipation fins, a memory assembly, or a cable, and the assist assembly is a wind scooper or a cable clip.

13. The electronic device according to claim 11, wherein the stop assembly has an elastic piece, and the stop portion is located on the elastic piece.

14. The electronic device according to claim 11, wherein the assist assembly has a guiding portion and a limiting portion, the guiding portion is adjacent to the limiting portion and the stop portion of the stop assembly is guided by the guiding portion to move toward the limiting portion, and the stop portion is limited to the limiting portion away from the assembling path of the cover.

15. The electronic device according to claim 12, wherein the assist assembly has a pressing portion, and the pressing portion presses the functional assembly against the main casing.

16. The electronic device according to claim 11, wherein the main casing has a guiding slot, the guiding slot has a first extension section and a second extension section that are perpendicular to each other, the cover has a guide pin, and the guide pin is moved within the guiding slot.

17. The electronic device according to claim 16, wherein the second extension section is parallel to the assembling path of the cover.

18. The electronic device according to claim 11, wherein the cover has an opening slot, and when the stop portion extends into the opening slot, the cover is stopped by the stop portion.

19. The electronic device according to claim 18, wherein the stop assembly has a support portion, the support portion is adjacent to the stop portion, and when the stop portion extends into the opening slot, the support portion supports the cover.

20. The electronic device according to claim 11, wherein the assist assembly has an engaging portion, the main casing has an engaging slot, and the engaging portion and the engaging slot cooperate to position the assist assembly on the main casing.

\* \* \* \* \*